United States Patent
Muljono

(10) Patent No.: US 6,803,820 B1
(45) Date of Patent: Oct. 12, 2004

(54) APPARATUS AND METHOD FOR REDUCING COMMON-MODE CURRENT IN DIFFERENTIAL LINK

(75) Inventor: Harry Muljono, Union City, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/397,824

(22) Filed: Mar. 26, 2003

(51) Int. Cl.[7] .............................................. H03F 3/45
(52) U.S. Cl. ..................... 330/258; 330/260; 330/291; 327/108
(58) Field of Search ............................... 330/258, 260, 330/291; 327/108

(56) References Cited

U.S. PATENT DOCUMENTS 6,664,820 B1 * 12/2003 Estrada ....................... 327/108
2003/0098021 A1 * 5/2003 Heineke et al. ............. 359/189

FOREIGN PATENT DOCUMENTS

JP          4135305       *   5/1992

OTHER PUBLICATIONS

"Differential–to–common–mode Conversion", download from http://www.signalintegrity.com/Pubs/edn/DifftoCommonMode.htm, on Feb. 4, 2003, Oct. 17, 2002, 1pg.

"4.3—A 62Gb/s Backplane Interconnect ASIC Based on 3.1Gb/s Serial–Link Technology", download from http://www.signalintegrity.com/Pubs/edn/DifftoCommonMode.htm, on Feb. 4, 2003, 3pgs.

* cited by examiner

Primary Examiner—Michael B Shingleton
(74) Attorney, Agent, or Firm—Buckley, Maschoff & Talwalkar LLC

(57) ABSTRACT

An output buffer is configured to receive differential input signals and to transmit differential output signals. A pre-driver is coupled to the output buffer and is configured to receive a data input signal and to generate the differential input signals for the output buffer. A feedback loop is coupled between the output buffer and the pre-driver. The feedback loop is configured to generate a feedback signal on the basis of a signal level present in the output buffer. The pre-driver is configured to receive the feedback signal generated by the feedback loop.

20 Claims, 12 Drawing Sheets

APPARATUS AND METHOD FOR REDUCING COMMON-MODE CURRENT IN DIFFERENTIAL LINK

BACKGROUND

In a conventional differential link, two conductors are driven in complementary fashion by respective legs of an output buffer to generate differential output signals. Ideally the sum of the currents provided by the two legs of the output buffer is constant. However, in practice, it may occur during switching of the differential output signals that the current in one leg may decrease at a rate that is faster or slower than the rate of increase in the current in the other leg. As a result, an excess current may exit the output buffer in common-mode format. This may cause electromagnetic interference (EMI), a distortion in the duty cycle of the output signal, output jitter and/or a reduction in the "eye opening" at the receiver.

DETAILED DESCRIPTION

Figure 1:
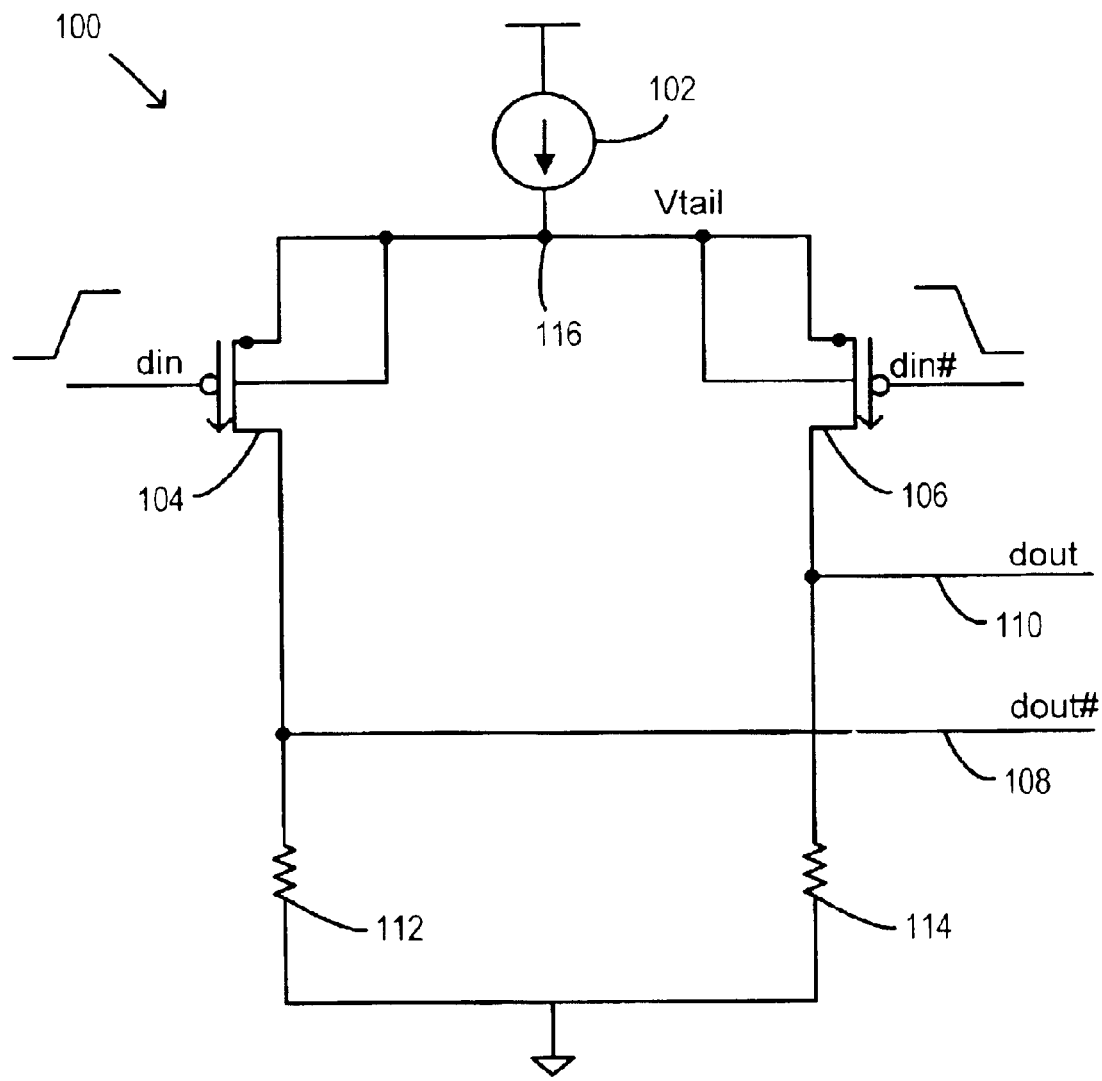
FIG. 1 is a schematic circuit diagram showing a conventional output buffer for a differential link.
Figure 2:
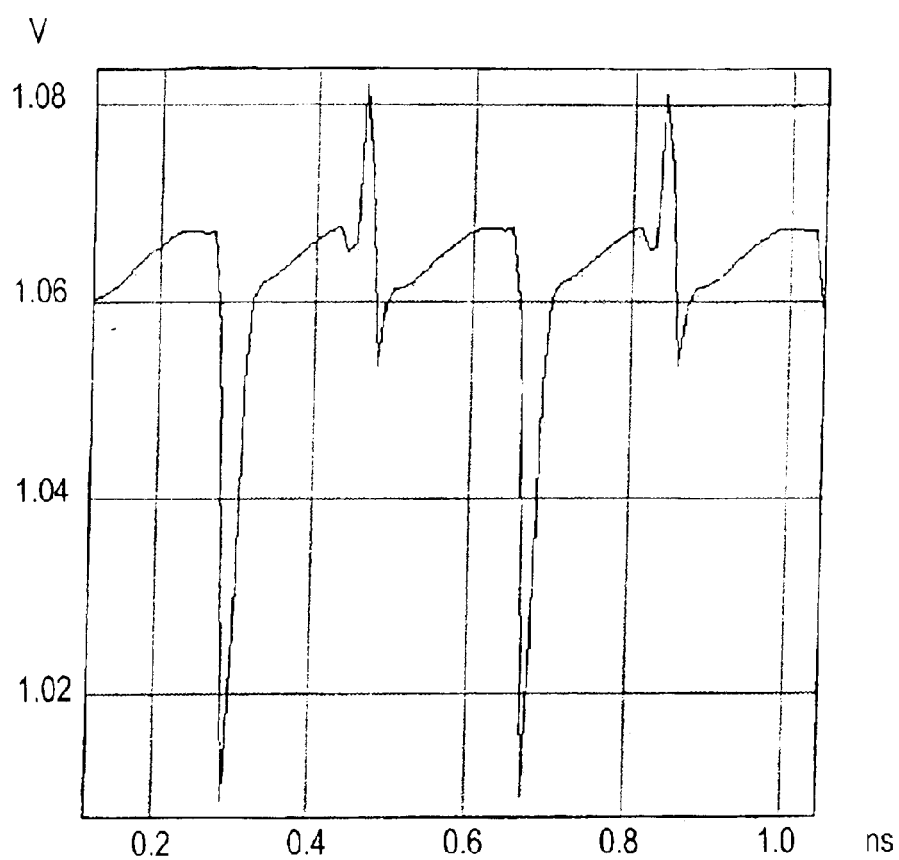
FIG. 2 is a simulated graph that illustrates voltage glitches that may be produced at common mode when the output buffer of FIG. 1 is operated in accordance with conventional practices.

FIG. 1 is a schematic circuit diagram showing a conventional output buffer 100 for a differential link. The output buffer 100 is driven by a current source 102 and includes transistors 104, 106. The source terminals of the transistors 104, 106 are coupled to the current source 102. The gate terminals of the transistors are coupled to receive control signals din, din#, respectively, provided by a pre-driver circuit, which is not shown. The drain terminals of the transistors are respectively coupled to output terminals 108 (dout#) and 110 (dout) and are also connected to ground via resistors 112, 114. Ideally, the sum of the currents at the output terminals is constant, but, in practice, when the output signals switch states, the rate at which one output signal decreases may differ from the rate at which the other output signal increases, resulting in voltage glitches at the "tail" node 116 to which the drain terminals of the transistors are coupled. FIG. 2 shows a simulated waveform that illustrates such voltage glitches. Common mode current escape may occur due to the voltage glitches, and electro-magnetic interference may result.

Figure 3:
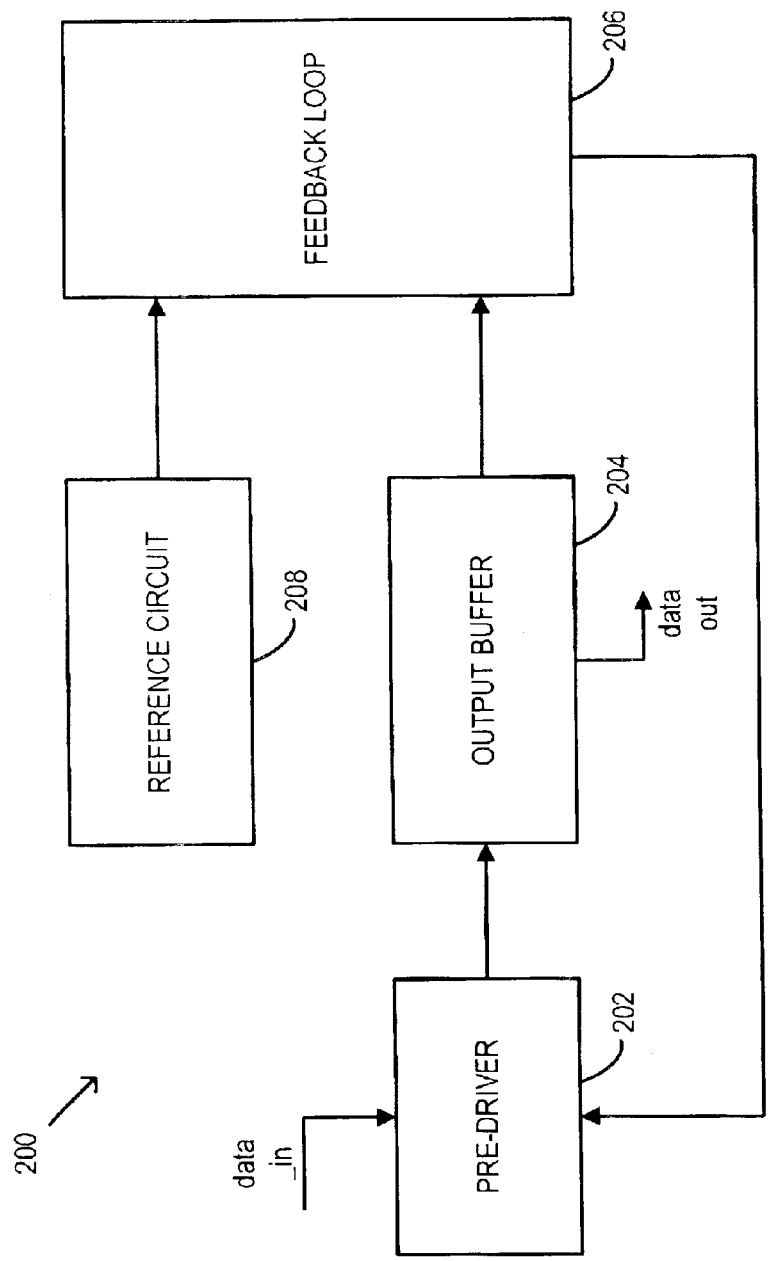
FIG. 3 is a block diagram illustration of a differential link interface according to some embodiments.

FIG. 3 is a block diagram that illustrates a differential link interface 200 according to some embodiments. The differential link interface 200 includes a pre-driver circuit 202 which receives a data signal data_in that is to be transmitted on a differential link (not shown) by the interface 200. The differential link interface 200 also includes an output buffer 204 which is coupled to the pre-driver 202 and receives control signals in the form of differential input signals from the pre-driver. The differential signals output to the differential link by the output buffer 204 are indicated as "data out" in FIG. 3.

Also included in the differential link interface 200 is a feedback loop 206 which is coupled between the output buffer 204 and the pre-driver 202. The differential link interface 200 further includes a reference circuit 208, that is coupled to the feedback loop 206 and provides a reference signal to the feedback loop. The feedback loop provides a feedback signal to the pre-driver 202. As will be seen, the feedback loop generates the feedback signal based on a signal level that is present in the output buffer 204 and based on the reference signal provided by the reference circuit 208.

Figure 4:
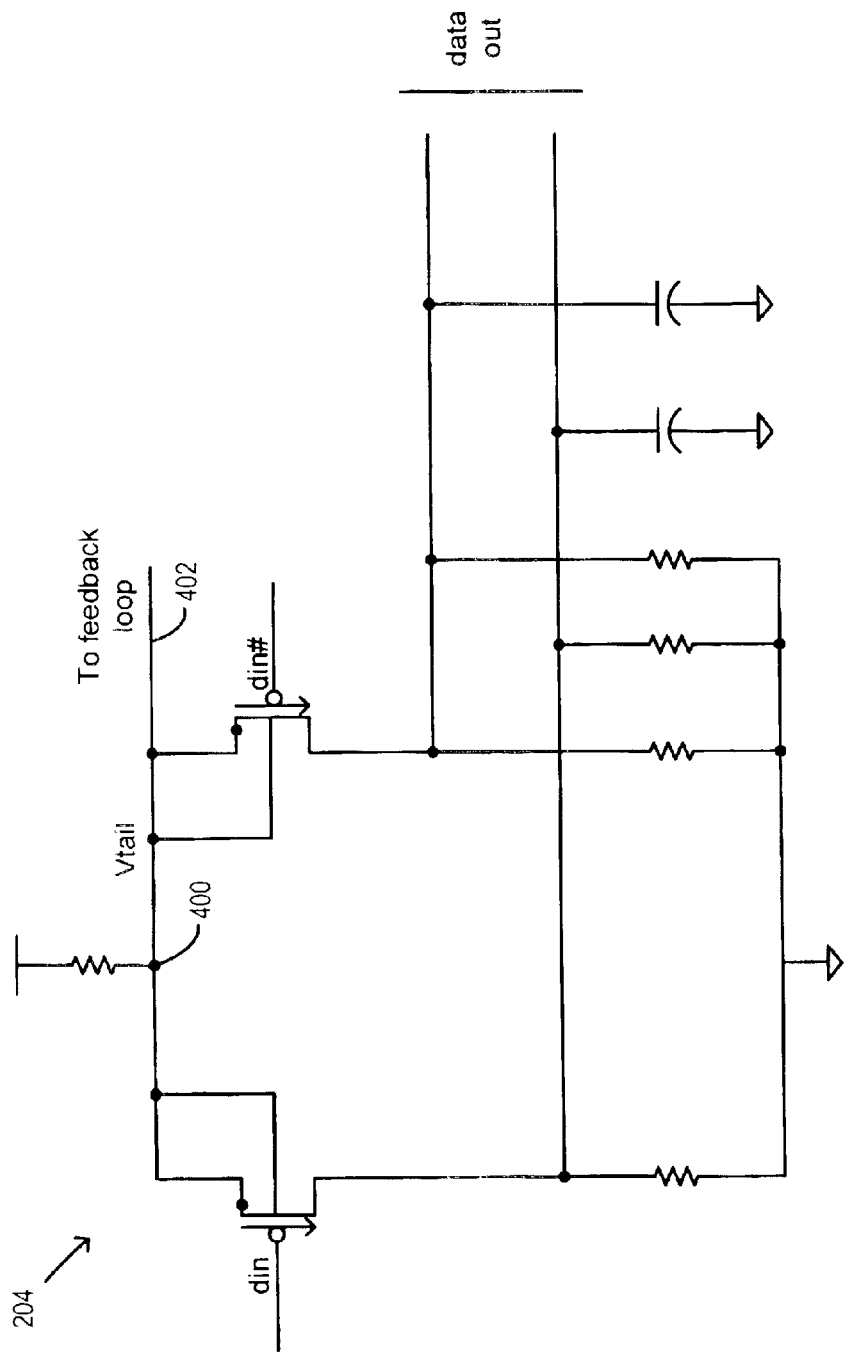
FIG. 4 is a schematic circuit diagram showing an output buffer that is part of the differential link interface of FIG. 3.

FIG. 4 is a schematic circuit diagram that illustrates the output buffer 204 shown in FIG. 3. In some embodiments, the output buffer 204 may be configured in accordance with conventional practices like the output buffer of FIG. 1 and therefore need not be described in detail. The signal level Vtail at the tail node 400 of the output buffer 204 may be provided as an input to the feedback loop, as indicated at 402.

Figure 5:
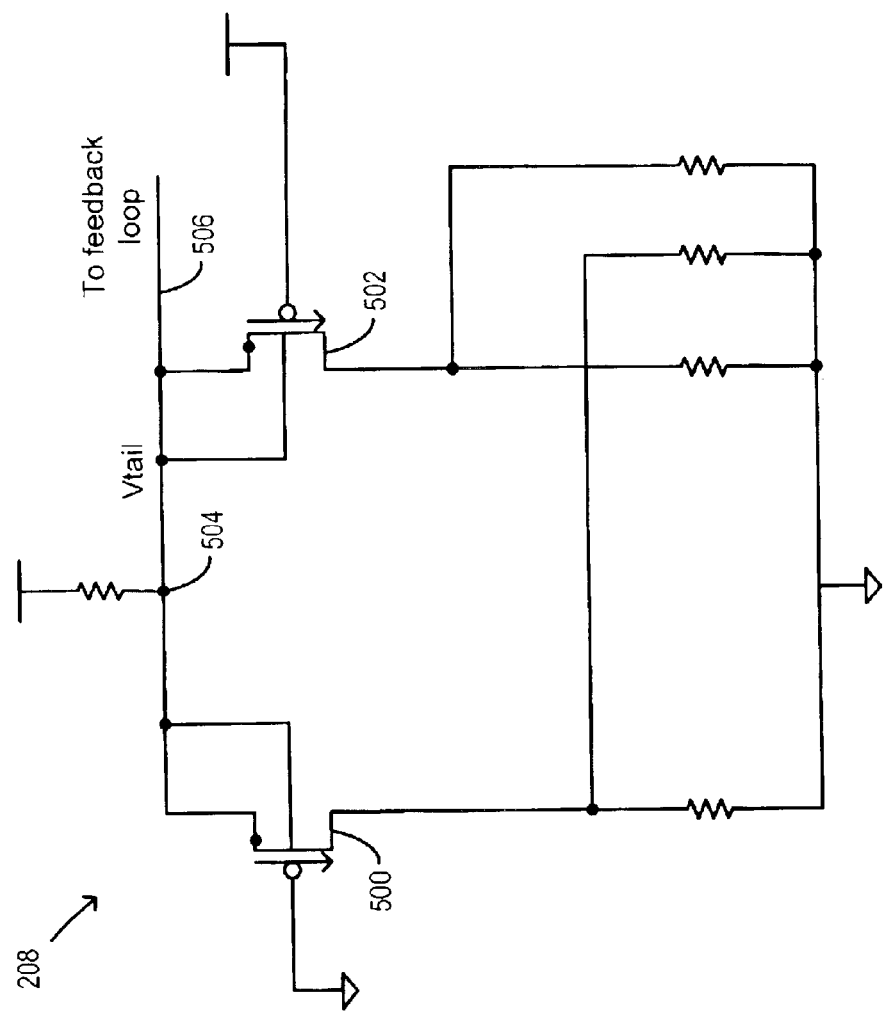
FIG. 5 is a schematic circuit diagram showing a reference circuit that is part of the differential link interface of FIG. 3.

FIG. 5 is a schematic circuit diagram that illustrates the reference circuit 208 shown in FIG. 3. In some embodiments, the reference circuit 208 may be configured as a replica of the output buffer 204. Thus, again, it is not necessary to describe the reference circuit 208 in detail, except to note that the gate terminals of its transistors 500, 502 are coupled to constant signal levels so that the reference circuit idles, exhibiting a constant signal level at its tail node 504. The constant signal level at the tail node 504 of the reference circuit 208 may be provided to the feedback loop (as indicated at 506) as the reference signal which was referred to above.

Figure 6:
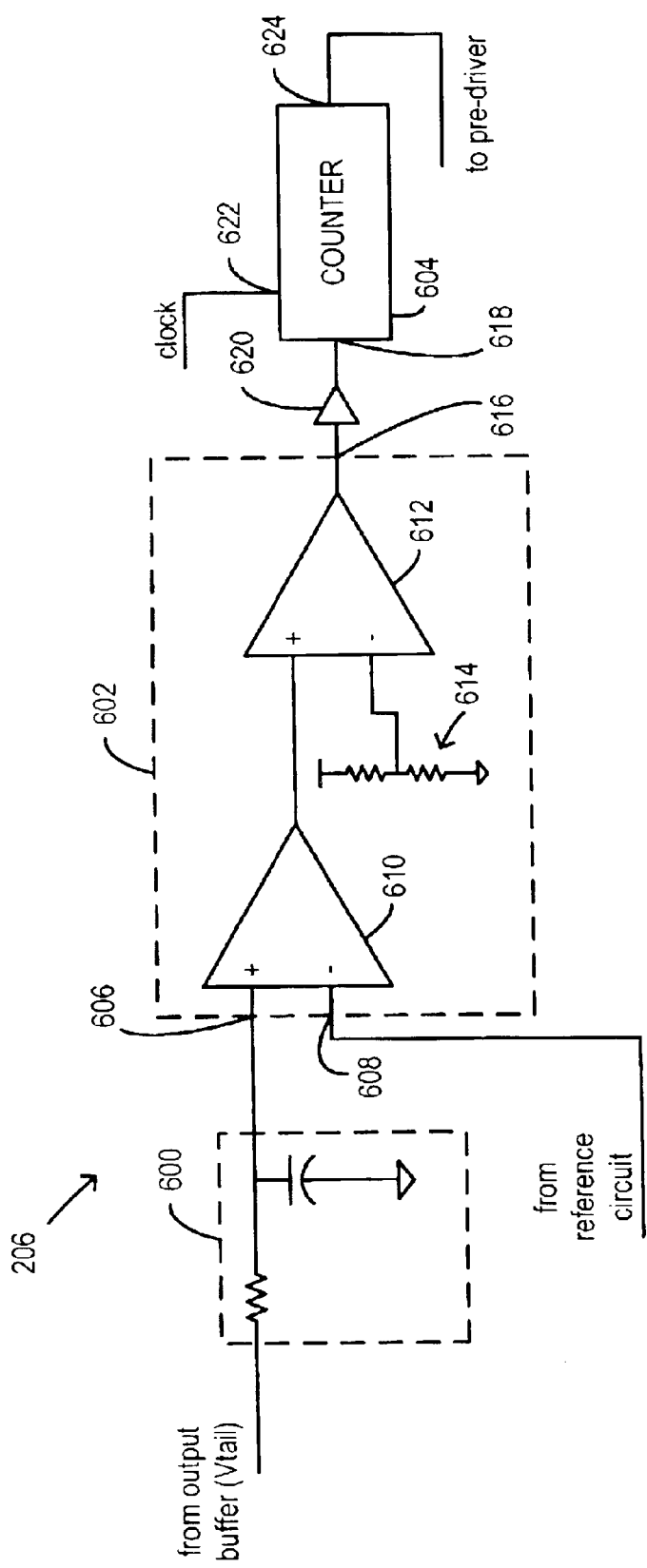
FIG. 6 is a schematic circuit diagram showing a feedback loop that is part of the differential link interface of FIG. 3.

FIG. 6 is a schematic circuit diagram that illustrates the feedback loop 206 shown in FIG. 3. The feedback loop 206 includes an analog filter 600, a differential amplifier 602 and a counter 604. The analog filter 600 is coupled to the tail node of the output buffer to receive the signal level Vtail present in the output buffer, and removes a high frequency component from Vtail. The differential amplifier 602 has a first input terminal 606 which is coupled to the analog filter 600 to receive the filtered signal level output from the analog filter. The differential amplifier 602 also has a second input terminal 608 which is coupled to the tail node of the reference circuit 208 to receive the substantially constant reference signal from the reference circuit. The differential amplifier 602 has a first amplifier stage 610 which receives the inputs from the analog filter and from the reference circuit. The differential amplifier also has a second amplifier stage 612 having one input coupled to the output of the first amplifier stage and another input coupled to receive a reference level from a voltage divider 614. The differential amplifier 602 is configured with two stages to improve the gain of the differential amplifier. However, the differential amplifier 602 may alternatively be provided in one stage or in three or more stages. In some embodiments, the differential amplifier functions as a high gain comparator. The differential amplifier 602 may operate so as to output a logical "1" level when the filtered signal level from the analog filter 600 exceeds the reference signal from the reference circuit, and to output a logical "0" level when the filtered signal level from the analog filter 600 does not exceed the reference signal. The output from the differential amplifier may be considered to be a comparison output.

The differential amplifier 602 has its output 616 coupled to an input 618 of the counter 604 via a buffer 620. The counter is driven by the comparison output provided by the differential amplifier 602 and also has a clock input 622 which receives a clock signal. The counter 604 may operate so as to either count up or count down at each cycle of the clock signal. The counter counts up one digit in a cycle of the clock signal for which the comparison output received from the differential amplifier is at a "1" logic level, and the counter counts down one digit in a cycle of the clock signal for which the comparison output is at a "0" logic level.

An output 624 of the counter 604 is coupled to an input of the pre-driver 202 (FIG. 3) to provide the current count in the counter 604 to the pre-driver as a digital count signal. In some embodiments, the digital count signal provided by the counter may be a 4-bit signal.

Figure 7:
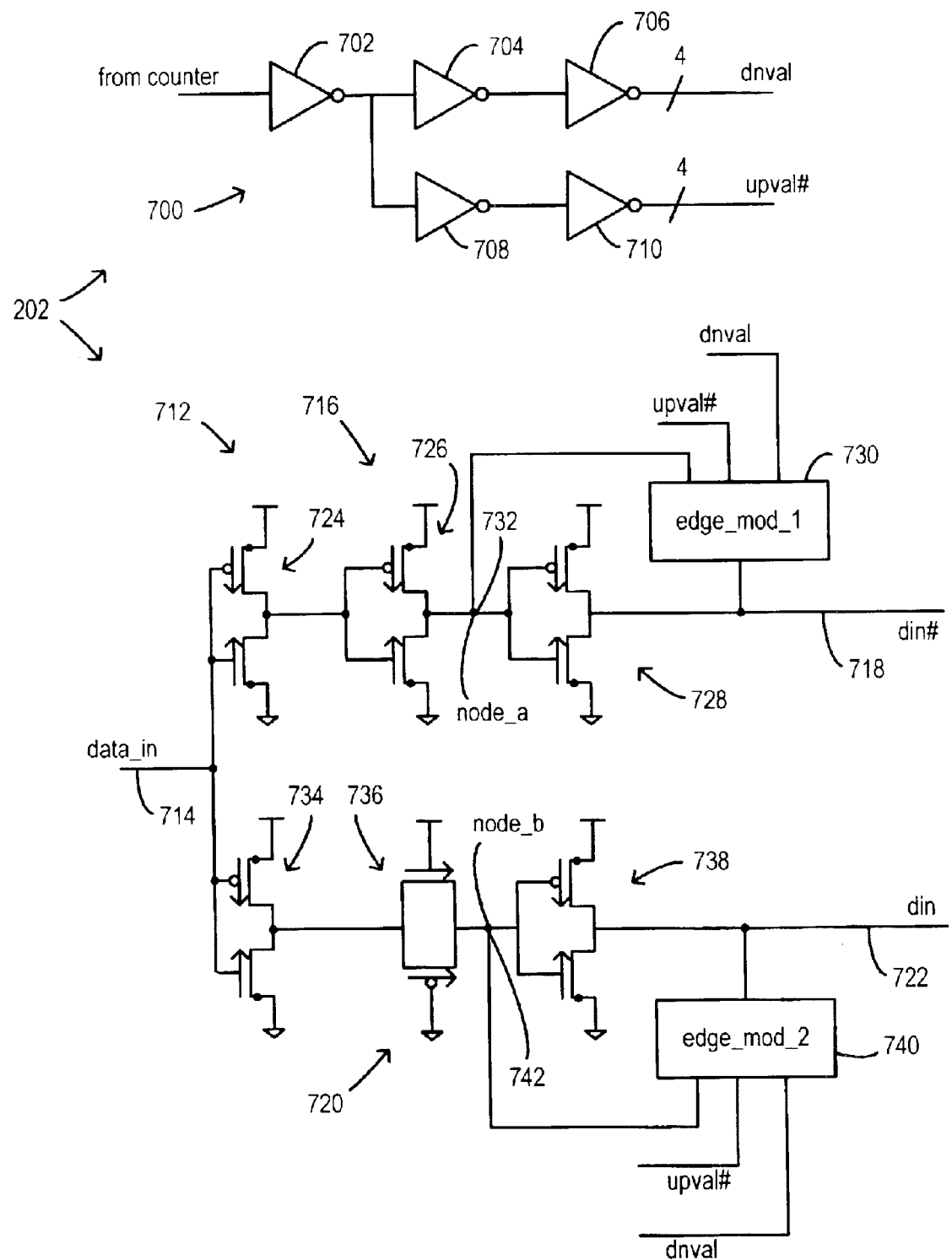
FIG. 7 is a schematic circuit diagram showing a pre-driver circuit that is part of the differential link interface of FIG. 3.

FIG. 7 is a schematic circuit diagram that illustrates the pre-driver 202 shown in FIG. 3.

The pre-driver 202 includes a feedback receive circuit 700, which is coupled to the counter 604 (FIG. 6) of the feedback loop 206, to receive the digital count signal (feedback signal) provided by the counter. The feedback receive circuit 700 includes a first inverting buffer 702 which receives the digital count signal. The feedback receive circuit also includes a second inverting buffer 704 coupled to an output of the first inverting buffer 702, and a third inverting buffer 706 coupled to an output of the second inverting buffer 704. The third inverting buffer 706 outputs a first edge modulation control signal dnval.

The feedback receive circuit 700 further includes a fourth inverting buffer 708 which is also coupled to the output of the first inverting buffer 702, and a fifth inverting buffer 710 which is coupled to an output of the fourth inverting buffer 708. The fifth inverting buffer outputs a second edge modulation control signal upval#.

Other arrangements to receive the feedback signal and generate edge modulation control signals are possible and will be described below.

The pre-driver 202 also includes a main portion 712, which receives the data signal data_in at an input terminal 714. The main portion 712 includes a first branch 716 that provides an inverted control signal din# for the output buffer 204 (FIGS. 3, 4) at a first output terminal 718 (FIG. 7) of the pre-driver 202. The main portion 712 also includes a second branch 720 that provides a non-inverted control signal din for the output buffer 204 at a second output terminal 722 of the pre-driver 202.

The first branch 716 includes a first inverter 724 formed of a p device and an n device which have their gates coupled to the input terminal 714. The first branch 716 also includes a second inverter 726 formed of a p device and an n device which have their gates coupled in common to the drains of the devices of the first inverter 724. The first branch 716 further includes a third inverter 728 formed of a p device and an n device which have their gates coupled in common to the drains of the devices of the second inverter 726. The drains of the devices of the third inverter 728 are coupled to the first output terminal 718 to produce the inverted control signal din#.

The first branch 716 also includes a first edge modulation circuit edge_mod_1 (reference numeral 730). The first edge modulation circuit is connected between a node_a (reference numeral 732; which is the connection point between the second inverter 726 and the third inverter 728) and the first output terminal 718. The first edge modulation circuit 730 also receives the first and second edge modulation control signals dnval and upval# and operates to modulate edges of the inverted control signal din# to aid in minimizing glitches in Vtail in the output buffer 204 (FIGS. 3, 4). Details of the first edge modulation circuit 730 will be described below in conjunction with FIG. 8.

The second branch 720 of the main portion 712 of the pre-driver 202 includes a fourth inverter 734 formed of a p device and an n device which have their gates coupled to the input terminal 714. The second branch also includes a pass circuit 736 formed of a p device and an n device which have their sources coupled in common to the drains of the fourth inverter 734. The second branch 720 further includes a fifth inverter 738 formed of a p device and an n device which have their gates coupled in common to the drains of the devices of the pass circuit 736. The drains of the devices of the fifth inverter 738 are coupled to the second output terminal 722 to produce the non-inverted control signal din.

The second branch 720 also includes a second edge modulation circuit edge_mod_2 (reference numeral 740). The second edge modulation circuit is connected between a node_b (reference numeral 742; which is the connection point between the pass circuit 736 and the fifth inverter 738) and the second output terminal 722. The second edge modulation circuit 740 also receives the first and second edge modulation control signals dnval and upval# and operates to modulate edges of the non-inverted control signal din to aid in minimizing glitches in Vtail in the output buffer 204. Details of the second edge modulation circuit 740 will be described immediately below in conjunction with FIG. 8. (It is noted that the connections between the feedback receive circuit 700 and the edge modulation circuits 730, 740 are omitted to simplify FIG. 7.)

The first and second edge modulation circuits 730, 740 may be substantially identical to each other. Accordingly, the schematic circuit diagram of FIG. 8 may be taken to illustrate both of the circuits 730, 740.

Figure 8:
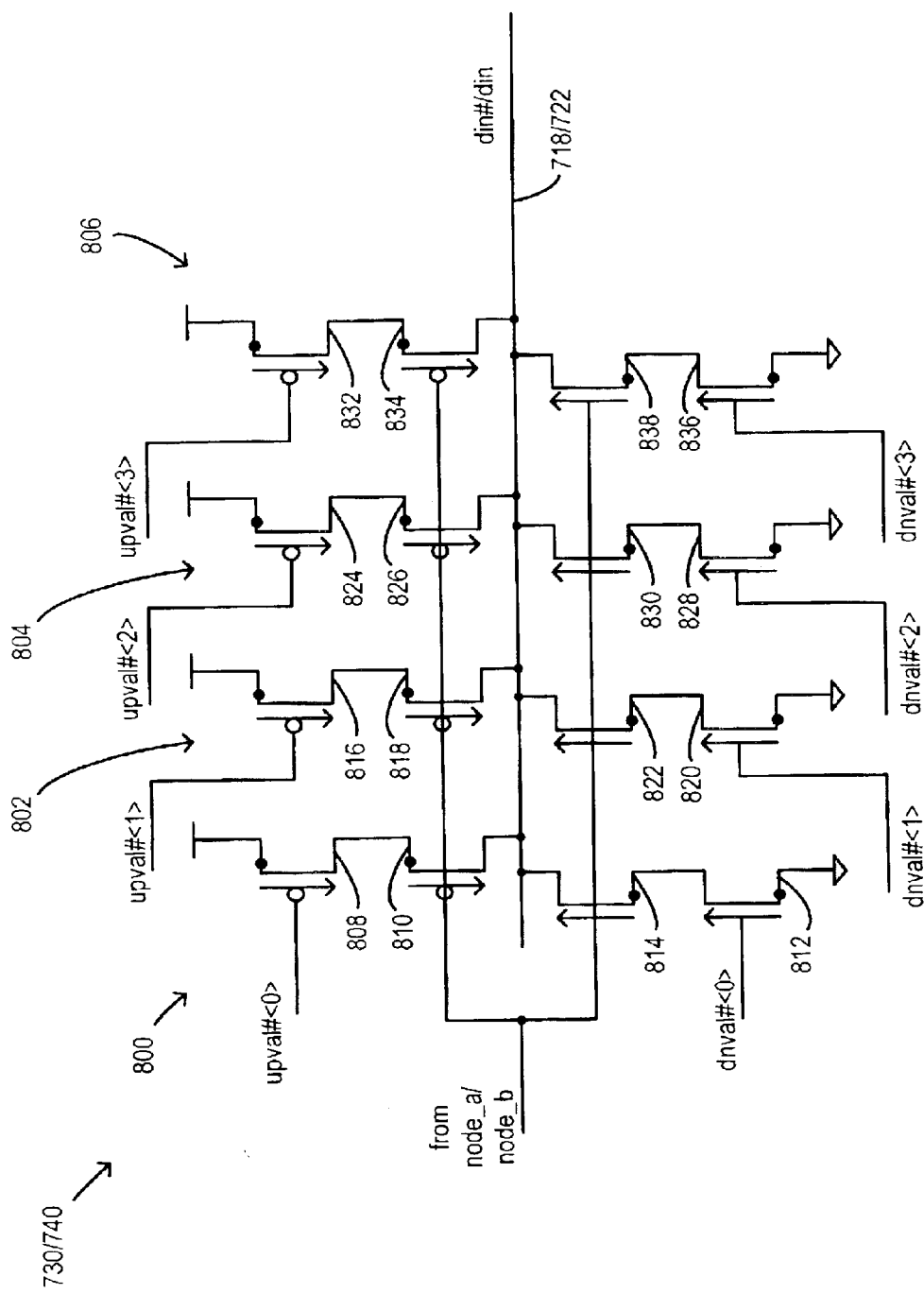
FIG. 8 is a schematic circuit diagram showing a typical one of edge modulation circuits that are part of the pre-driver circuit of FIG. 7.

The edge modulation circuit illustrated in FIG. 8 includes a first stage 800, a second stage 802, a third stage 804 and a fourth stage 806.

The first stage 800 includes two p MOSFETs 808, 810 connected in series between the power supply and the output terminal (718 or 722, as the case may be), and two n MOSFETs 812, 814 connected in series between ground and the output terminal. The gates of the MOSFETs 810, 814 are coupled to node_a or node_b, as the case may be. The gate of the p MOSFET 808 is controlled by the lowest order bit of the second edge modulation control signal upval#. The gate of the n MOSFET 814 is controlled by the lowest order bit of the first edge modulation control signal dnval.

The second stage 802 includes two p MOSFETs 816, 818 connected in series between the power supply and the output terminal (718 or 722, as the case may be), and two n MOSFETs 820, 822 connected in series between ground and the output terminal. The gates of the MOSFETs 818, 822 are coupled to node_a or node_b, as the case may be. The gate of the p MOSFET 816 is controlled by the next-to-the-lowest order bit of the second edge modulation control signal upval#. The gate of the n MOSFET 820 is controlled by the next-to-the-lowest order bit of the first edge modulation control signal dnval. The transistors of the second stage 802 have twice the current capacity of the transistors of the first stage 800.

The third stage 804 includes two p MOSFETs 824, 826 connected in series between the power supply and the output terminal (718 or 722, as the case may be), and two n MOSFETs 828, 830 connected in series between ground and the output terminal. The gates of the MOSFETs 826, 830 are coupled to node_a or node_b, as the case may be. The gate of the p MOSFET 824 is controlled by the third-from-the-lowest order bit of the second edge modulation control signal upval#. The gate of the n MOSFET 828 is controlled by the third-from-the-lowest order bit of the first edge modulation control signal dnval. The transistors of the third stage 804 have twice the current capacity of the transistors of the second stage 802.

The fourth stage 806 includes two p MOSFETs 832, 834 connected in series between the power supply and the output terminal (718 or 722, as the case may be), and two n MOSFETs 836, 838 connected in series between ground and the output terminal. The gates of the MOSFETs 834, 838 are coupled to node_a or node_b, as the case may be. The gate of the p MOSFET 832 is controlled by the highest order bit of the second edge modulation control signal upval#. The gate of the n MOSFET 836 is controlled by the highest order bit of the first edge modulation control signal dnval. The transistors of the fourth stage 806 have twice the current capacity of the transistors of the third stage 804.

Under the control of the edge modulation control signals dnval and upval#, the edge modulation circuits 730, 740 are operable to modulate edges of the control signals din, din#, and hence the edges of the output signals dout, dout# of the output buffer 204 (FIGS. 3, 4) to a degree which corresponds to the digital count signal provided by the counter 604 (FIG. 6) of the feedback loop 206 (FIGS. 3, 6).

Figure 8A:
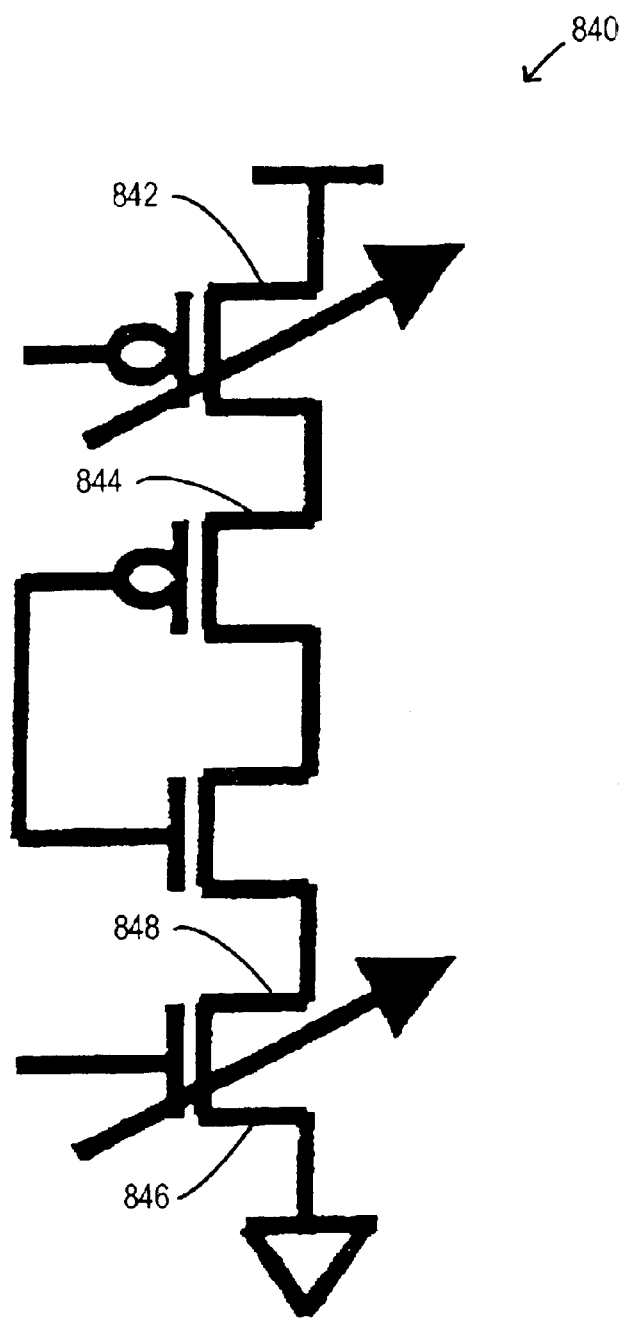
FIG. 8A is a schematic circuit diagram that illustrates an equivalent circuit to the edge modulation circuit of FIG. 8.

FIG. 8A is a schematic circuit diagram that illustrates a circuit that may be considered to be equivalent to the edge modulation circuits as illustrated in FIG. 8. The equivalent circuit 840 shown in FIG. 8A includes a variable p transistor 842 (equivalent to transistors 808, 816, 824 and 832 of FIG. 8, taken together) in series with a p transistor 844; and a variable n transistor 846 (equivalent to transistors 812, 820, 828 and 836 of FIG. 8, taken together) in series with an n transistor 846. The variable transistors 842, 846 are effectively controlled by the feedback signal from the feedback loop 206.

In operation, the differential link interface 200 receives a data signal data in which is to be transmitted in the form of a differential signal by the output buffer 204. From the data signal data_in, the pre-driver 202 generates control signals din, din# for the output buffer 204. Responsive to the control signals din, din#, the output buffer 204 generates differential output signals dout, dout#. The feedback loop 206 receives the signal level Vtail from the tail node 400 (FIG. 4) of the output buffer 204. That signal is filtered by the analog filter 600 (FIG. 6) of the feedback loop 206 and the resulting filtered signal is provided as one input to the differential amplifier 602. As its other input, the differential amplifier 602 receives the signal level at the tail node 504 (FIG. 5) of the reference circuit 208. As noted above, the reference circuit 208 is a replica of the output buffer 204. The reference circuit is maintained in an idle condition, so that the signal level at its tail node 504 remains substantially constant and equal to a nominal value of the signal level Vtail at the tail node 400 of the output buffer 204.

The differential amplifier 602 compares the filtered signal which originates with the output buffer 204 with the reference level provided by the reference circuit 206. When the former exceeds the latter, the differential amplifier outputs a logical "1" signal to the counter 604. At other times the differential amplifier outputs a logical "0" to the counter 604.

Each time the counter 604 is clocked by a clock signal, it either counts up (thereby increasing its count value by 1) if the signal from the differential amplifier is "1", or it counts down (thereby decreasing its count value by 1) if the signal from the differential amplifier is "0". The current count value of the counter 604 is fed back to the pre-driver 202. The extent to which the edge modulation circuits 730, 740 of the pre-driver are active is controlled on the basis of the count value of the counter 604.

Figure 9:
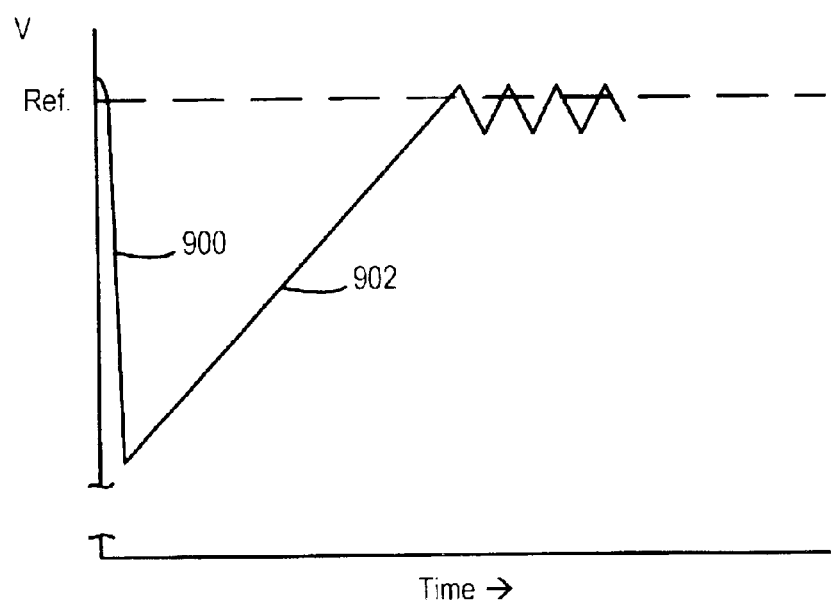
FIG. 9 is a graph that shows a simulated signal that illustrates compensation for signal edge imbalance in some embodiments.
Figure 10:
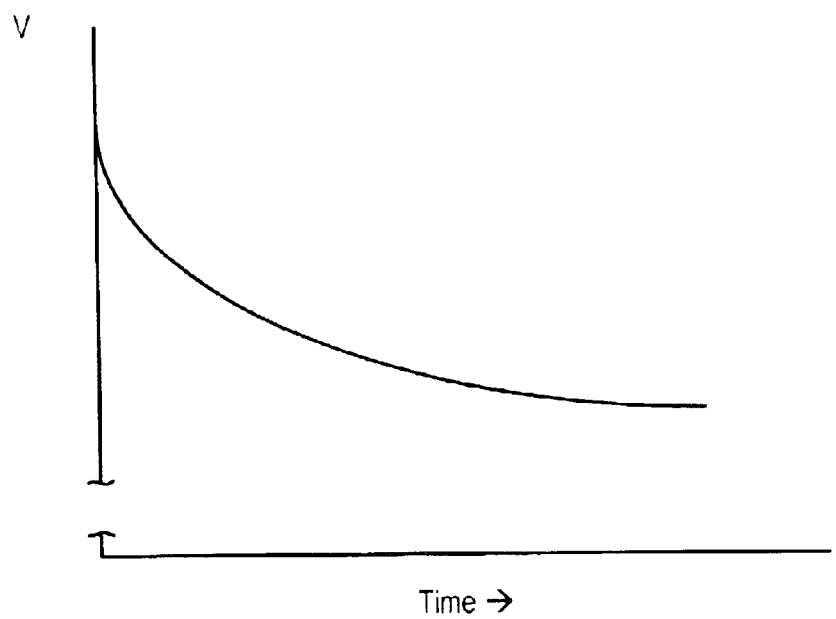
FIG. 10 is a simulated graph that shows reduction of common mode voltage in some embodiments.

When the data signal data in changes state, the control signals din, din# provided by the pre-driver 202 exhibit rising or falling edges and the output signals dout, dout# of the output buffer 204 exhibit rising of falling edges. If the rate at which one output signal rises differs from the rate at which the other output signal falls, the level Vtail at the tail node 400 in the output buffer 204 departs from the nominal value for Vtail. The nominal value for Vtail is indicated by the reference signal provided by the reference circuit 208. An example of a departure from the nominal value of Vtail is indicated at 900 in FIG. 9. A departure from the nominal value of Vtail is reflected in the count value of the counter 604. The edge modulation circuits 730, 740 are controlled according to the count value of the counter 604 to modulate the rising or falling edges of the control signals din, din#, thereby also modulating the rising or falling edges of the output signals dout, dout# of the output buffer 204. The value of Vtail is thus driven back toward its nominal value, as indicated at 902. This causes a reduction in the common mode signal, as illustrated in FIG. 10.

With the reduction in common mode signal, the possibility of electromagnetic interference caused by the differential link interface is reduced. Distortion of the duty cycle of the output signal may also be reduced, as is illustrated in FIGS. 11 and 12.

Figure 11:
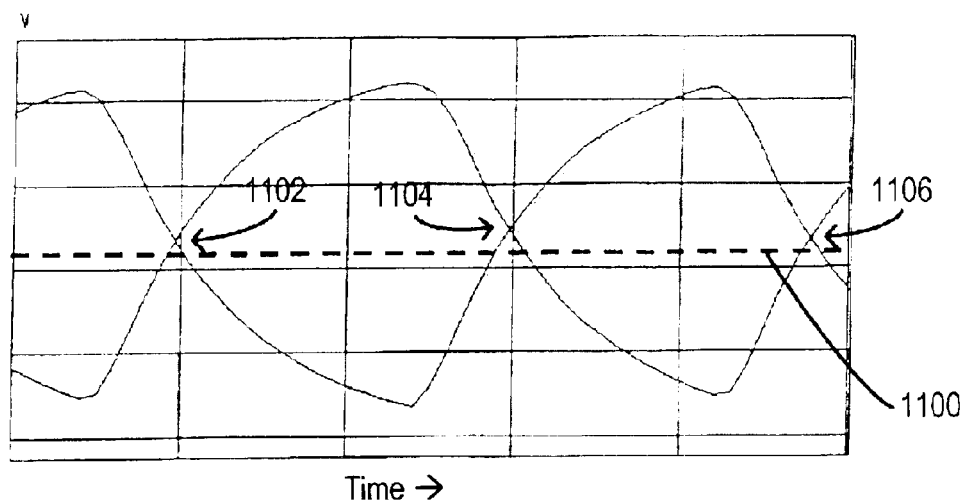
FIG. 11 is a graph that shows simulated signal traces that illustrate signal distortion in an output signal provided in accordance with conventional practices.

FIG. 11 is a simulated graph of output signals dout, dout# that may be provided by an output buffer that is driven in accordance with conventional practices. In FIG. 11, the dashed line 1100 indicates a signal level that is half-way between the upper and lower peaks of the signals. This is the ideal crossing point between the signals. However, as indicated at 1102, 1104, 1106, the actual crossing points are displaced above the ideal crossing point indicated at 1100. Thus the duty cycle of the signals is distorted.

Figure 12:
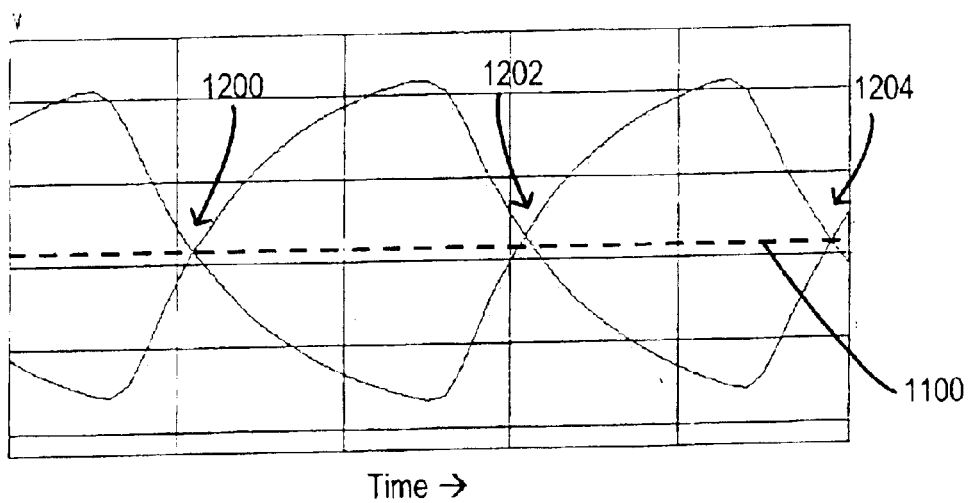
FIG. 12 is a graph that shows simulated signal traces having reduced distortion in some embodiments.

FIG. 12 is a simulated graph of output signals dout, dout# provided by an output buffer that is part of the differential link interface 200 illustrated in FIGS. 3–8. If the crossing points 1200, 1202, 1204 are examined, it will be observed that the crossing points substantially coincide with the ideal crossing point 1100. Accordingly, the distortion in the duty cycle of the signals has been reduced or substantially eliminated.

In the embodiment described above, two identical edge modulation control signals were derived from the digital feedback signal provided by the counter that is part of the feedback loop. However, other arrangements are possible. For example, two different feedback signals may be provided, each by a respective counter, and the pre-driver may be arranged to receive the two feedback signals.

The feedback loop may be changed in other ways. For example, analog feedback may be employed, and the pre-driver may be arranged to selectively modulate the edges of the control signals din, din# in response to one or more analog feedback signals.

As another alternative, the feedback signal, if digital as illustrated in FIGS. 3–8, may consist of more or fewer than the 4 bits shown. The edge modulation circuits of the pre-driver may be modified accordingly.

Instead of binary control of the edge modulation circuits, linear or other control may be employed.

In some embodiments, the feedback signal generated by the feedback loop may be shared among a plurality of pre-drivers (each coupled to a respective output buffer). In this case the output buffer from which the feedback signal is derived may be coupled to drive a differential load rather than an actual link, and the pre-driver for that output buffer may be driven with a clock signal. In this case the circuit from which the feed back loop signal is obtained (including pre-driver, dummy output buffer, reference circuit and feedback loop) may be used to provide automatic calibration for some or all of the differential link interfaces provided on the same chip.

Figure 13:
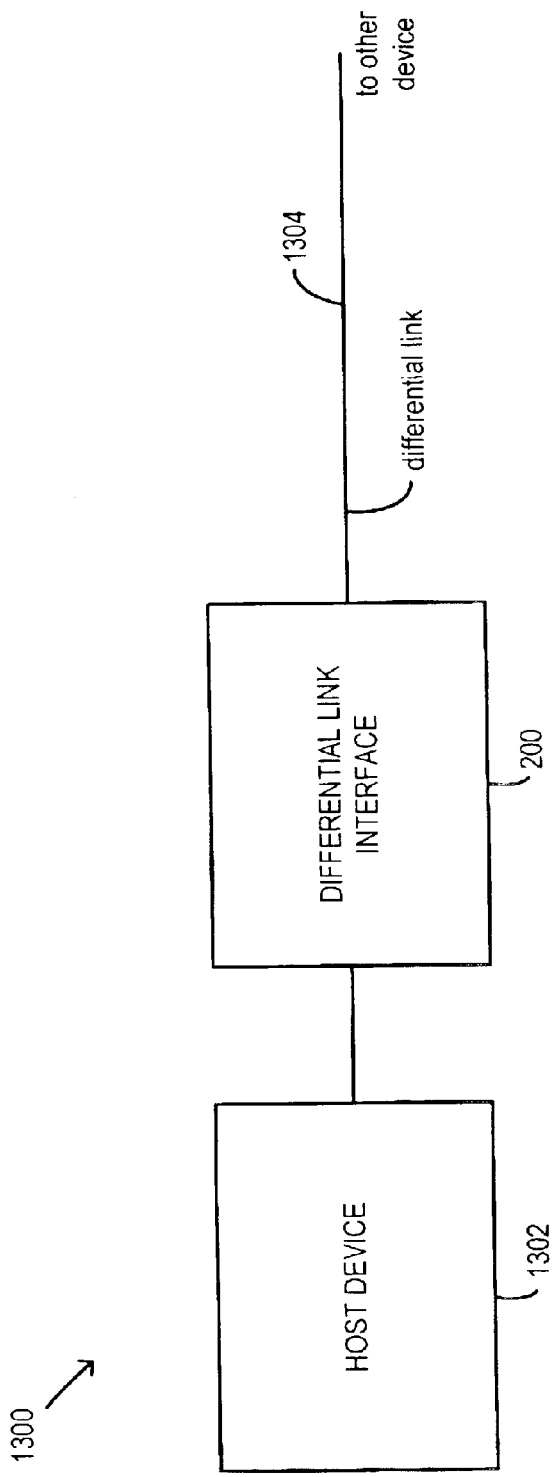
FIG. 13 is a block diagram of an apparatus provided according to some embodiments and including the differential link interface of FIG. 3.

FIG. 13 is a block diagram of an apparatus 1300 provided according to some embodiments and including the differential link interface 200 of FIG. 3. The apparatus 1300 includes a host device 1302 (e.g., a processor, a chip set, or any other device that outputs data) which is coupled to the differential link interface 200 and provides the signal data__in which is transmitted by the interface 200 in differential form on the differential link 1304.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. An apparatus comprising:
   an output buffer configured to receive differential input signals and to transmit differential output signals;
   a pre-driver coupled to the output buffer and configured to receive a data input signal and to generate the differential input signals received by the output buffer;
   a feedback loop coupled between the output buffer and the pre-driver and configured to generate a feedback signal on the basis of a signal level present in the output buffer, the pre-driver being configured to receive the feedback signal generated by the feedback loop; and
   a reference circuit that is a replica of the output buffer, the reference circuit configured to provide a reference signal to the feedback loop, the feedback loop configured to generate the feedback signal on the basis of the signal level present in the output buffer and the reference signal provided by the reference circuit.

2. The apparatus of claim 1, wherein the feedback loop comprises:
   an analog filter coupled to the output buffer and configured to receive the signal level and to output a filtered signal level;
   a differential amplifier coupled to the analog filter and to the reference circuit, and configured to generate a comparison output based on the filtered signal level and the reference signal; and
   a counter coupled to the differential amplifier and to the pre-driver, and configured to be driven by the comparison output and to provide a digital count signal to the pre-driver.

3. The apparatus of claim 2, wherein the pre-driver is configured to modulate rising and falling edges of the differential input signals in response to the digital count signal.

4. The apparatus of claim 3, wherein:
   the digital count signal includes a plurality of bit signals; and
   the pre-driver includes a plurality of transistors connected in parallel between a power supply and an output terminal of the pre-river, each of the transistors being responsive to a respective one of the bit signals.

5. The apparatus of claim 4, wherein the plurality of bit signals includes four bit signals and the plurality of transistors includes four transistors.

6. The apparatus of claim 5, wherein the four transistors include a first transistor, a second transistor, a third transistor and a fourth transistor;
   the second transistor having a current capacity that is substantially twice a current capacity of the first transistor, the third transistor having a current capacity that is substantially twice the current capacity of the second transistor, the fourth transistor having a current capacity that is substantially twice the current capacity of the third transistor.

7. The apparatus of claim 4, wherein the plurality of transistors includes a first transistor, a second transistor and a third transistor;
   the second transistor having a current capacity that is substantially twice a current capacity of the first transistor, the third transistor having a current capacity that is substantially twice the current capacity of the second transistor.

8. A method comprising:
   providing a pre-driver to drive an output buffer for a differential link;
   deriving a feedback signal from a signal level present in the output buffer; and
   controlling the pre-driver with the feedback signal;
   wherein the deriving includes:
   comparing the signal level present in the output buffer with a reference signal; and
   obtaining the reference signal from a reference circuit that is a replica of the output buffer.

9. The method of claim 8, wherein the feedback signal is a digital signal.

10. A method comprising:
    providing a pre-driver to drive an output buffer for a differential link;
    deriving a feedback signal from a signal level present in the output buffer; and
    controlling the pre-driver with the feedback signal;
    wherein the controlling includes modulating rising and falling edges of differential input signals provided by the pre-driver to the output buffer.

11. An apparatus comprising:

a host device;

an output buffer configured to receive differential input signals and to transmit differential output signals;

a pre-driver coupled to the host device and to the output buffer, the pre-driver being configured to receive a data signal from the host device and to generate the differential input signals received by the output buffer; and a feedback loop coupled between the output buffer and the pre-driver and configured to generate a feedback signal on the basis of a signal level present in the output buffer, the pre-driver being configured to receive the feedback signal generated by the feedback loop; and a reference circuit that is a replica of the output buffer, the reference circuit configured to provide a reference signal to the feedback loop, the feedback loop configured to generate the feedback signal on the basis of the signal level present in the output buffer and the reference signal provided by the reference circuit.

12. The apparatus of claim 11, wherein the feedback loop comprises:

an analog filter coupled to the output buffer and configured to receive the signal level and to output a filtered signal level;

a differential amplifier coupled to the analog filter and to the reference circuit, and configured to generate a comparison output based on the filtered signal level and the reference signal; and a counter coupled to the differential amplifier and to the pre-driver, and configured to be driven by the comparison output and to provide a digital count signal to the pre-driver.

13. The apparatus of claim 12, wherein the pre-driver is configured to modulate rising and falling edges of the differential input signals in response to the digital count signal.

14. The apparatus of claim 13, wherein:

the digital count signal includes a plurality of bit signals; and the pre-driver includes a plurality of transistors connected in parallel between a power supply and an output terminal of the pre-driver, each of the transistors being responsive to a respective one of the bit signals.

15. The apparatus of claim 14, wherein the plurality of bit signals includes four bit signals and the plurality of transistors includes four transistors.

16. The apparatus of claim 15, wherein the four transistors include a first transistor, a second transistor, a third transistor and a fourth transistor;

the second transistor having a current capacity that is substantially twice a current capacity of the first transistor, the third transistor having a current capacity that is substantially twice the current capacity of the second transistor, the fourth transistor having a current capacity that is substantially twice the current capacity of the third transistor.

17. The apparatus of claim 14, wherein the plurality of transistors includes a first transistor, a second transistor and a third transistor;

the second transistor having a current capacity that is substantially twice a current capacity of the first transistor, the third transistor having a current capacity that is substantially twice the current capacity of the second transistor.

18. An apparatus comprising:

an output buffer configured to receive differential input signals and to transmit differential output signals;

pre-driver coupled to the output buffer and configured to receive a data input signal and to generate the differential input signals received by the output buffer; and a feedback loop coupled between the output buffer and the pre-driver and configured to generate a feedback signal on the basis of a signal level present in the output buffer, the pre-driver being configured to receive the feedback signal generated by the feedback loop;

wherein the pre-driver includes at least one edge modulation circuit to modulate rising and falling edges of the differential input signals in response to the feedback signal.

19. The apparatus of claim 18, wherein the feedback loop comprises:

an analog filter coupled to the output buffer and configured to receive the signal level and to output a filtered signal level;

a differential amplifier coupled to the analog filter and to a reference circuit, and configured to generate a comparison output based on the filtered signal level and a reference signal provided by the reference circuit; and a counter coupled to the differential amplifier and to the pre-driver, and configured to be driven by the comparison output and to provide a digital count signal to the pre-driver.

20. The apparatus of claim 19, wherein:

the digital count signal includes a plurality of bit signals; and the pre-driver includes a plurality of transistors connected in parallel between a power supply and an output terminal of the pre-driver, each of the transistors being responsive to a respective one of the bit signals.

* * * * *